United States Patent
Kawaguchi et al.

(10) Patent No.: US 9,159,593 B2
(45) Date of Patent: Oct. 13, 2015

(54) METHOD OF PARTICLE CONTAMINANT REMOVAL

(75) Inventors: Mark Naoshi Kawaguchi, Sunnyvale, CA (US); David Mui, Fremont, CA (US); Mark Wilcoxson, Oakland, CA (US)

(73) Assignee: Lam Research Corporation, Fremont, CA (US)

(*) Notice: Subject to any disclaimer, the term of this patent is extended or adjusted under 35 U.S.C. 154(b) by 787 days.

(21) Appl. No.: 12/485,733

(22) Filed: Jun. 16, 2009

(65) Prior Publication Data

US 2010/0313917 A1    Dec. 16, 2010

(51) Int. Cl.
| | |
|---|---|
| *B08B 3/10* | (2006.01) |
| *H01L 21/67* | (2006.01) |
| *H01L 21/02* | (2006.01) |
| *B08B 7/00* | (2006.01) |
| *C11D 11/00* | (2006.01) |
| *C11D 17/04* | (2006.01) |

(52) U.S. Cl.
CPC ............ *H01L 21/67051* (2013.01); *B08B 3/10* (2013.01); *B08B 7/0014* (2013.01); *H01L 21/02052* (2013.01); *H01L 21/02057* (2013.01); *C11D 11/0047* (2013.01); *C11D 11/0058* (2013.01); *C11D 17/049* (2013.01)

(58) Field of Classification Search
CPC ............. B08B 3/08; B08B 5/04; B08B 3/12; B08B 3/10; B08B 7/0014; H01L 21/02057; H01L 21/67051; H01L 21/02041; H01L 21/02043; H01L 21/02052
USPC .......................... 134/114.8, 53, 157, 902, 148
See application file for complete search history.

(56) References Cited

U.S. PATENT DOCUMENTS

| | | | | |
|---|---|---|---|---|
| 3,994,744 | A | * | 11/1976 | Anderle et al. .................. 134/4 |
| 4,586,962 | A | * | 5/1986 | Barabas ............................ 134/4 |
| 4,903,717 | A | * | 2/1990 | Sumnitsch .................. 134/99.1 |
| 5,372,652 | A | * | 12/1994 | Srikrishnan et al. ............. 134/7 |
| 5,883,169 | A | * | 3/1999 | Spector et al. ................ 524/292 |
| 5,918,817 | A | | 7/1999 | Kanno et al. |
| 6,017,585 | A | * | 1/2000 | Thomas ........................ 427/240 |

(Continued)

FOREIGN PATENT DOCUMENTS

| | | | |
|---|---|---|---|
| JP | 01-135574 | * | 5/1989 |
| JP | 10-156229 | | 6/1998 |

(Continued)

OTHER PUBLICATIONS

IBM Technical Disclosure Bulletin, July 2980 vol. 23.*

(Continued)

*Primary Examiner* — Joseph L Perrin
*Assistant Examiner* — Kevin G Lee
(74) *Attorney, Agent, or Firm* — Martine Penilla Group, LLP

(57) ABSTRACT

Apparatus and methods for removing particle contaminants from a solid surface includes providing a layer of a viscoelastic material on the solid surface. The viscoelastic material is applied as a thin film and exhibits substantial liquid-like characteristics. The viscoelastic material at least partially binds with the particle contaminants. A high velocity liquid is applied to the viscoelastic material, such that the viscoelastic material exhibits solid-like behavior. The viscoelastic material is thus dislodged from the solid surface along with the particle contaminants, thereby cleaning the solid surface of the particle contaminants.

18 Claims, 13 Drawing Sheets

(56) References Cited

U.S. PATENT DOCUMENTS

| | | | |
|---|---|---|---|
| 6,619,301 B2 * | 9/2003 | Kobayashi et al. | 134/1.3 |
| 6,642,142 B2 | 11/2003 | Nagai et al. | |
| 6,776,171 B2 * | 8/2004 | Carpenter et al. | 134/1.3 |
| 6,951,221 B2 * | 10/2005 | Okuda et al. | 134/56 R |
| 7,204,890 B2 | 4/2007 | Held, III et al. | |
| 7,479,205 B2 | 1/2009 | Okuda et al. | |
| 7,833,357 B2 * | 11/2010 | Fox et al. | 134/1 |
| 7,837,803 B2 * | 11/2010 | Hohenwarter | 134/21 |
| 8,037,891 B2 * | 10/2011 | Kanno et al. | 134/95.3 |
| 8,522,801 B2 * | 9/2013 | Freer et al. | 134/93 |
| 2006/0151008 A1 | 7/2006 | Takushima | |
| 2006/0174920 A1 | 8/2006 | Randhawa | |
| 2006/0252354 A1 * | 11/2006 | Arana et al. | 451/28 |
| 2007/0054115 A1 * | 3/2007 | Codding et al. | 428/343 |
| 2007/0084485 A1 * | 4/2007 | Freer et al. | 134/26 |
| 2007/0087950 A1 * | 4/2007 | Korolik et al. | 510/175 |
| 2007/0151583 A1 | 7/2007 | Freer et al. | |
| 2008/0121252 A1 | 5/2008 | Miya | |
| 2008/0135069 A1 | 6/2008 | Lu et al. | |
| 2008/0317949 A1 * | 12/2008 | Edgington et al. | 427/154 |
| 2010/0258142 A1 * | 10/2010 | Kawaguchi et al. | 134/1.3 |

FOREIGN PATENT DOCUMENTS

| | | | |
|---|---|---|---|
| JP | 2004-200282 | * | 7/2004 |
| JP | 2008-135557 | | 6/2008 |
| JP | 2009-522777 | | 2/2009 |
| WO | WO 2004/088735 A1 | | 10/2004 |
| WO | WO 2007/078955 A2 | | 7/2007 |

OTHER PUBLICATIONS

Notification Concerning Transmittal of International Preliminary Report on Patentability (IPRP), IPRP, and Written Opinion of the International Searching Authority, issued in International Application No. PCT/US2010/036754, dated Dec. 29, 2011 (8 total pages).
JP Application No. 2012-516103, Notification of Reason(s) for Rejection dated Feb. 25, 2014.

* cited by examiner

METHOD OF PARTICLE CONTAMINANT REMOVAL

CROSS REFERENCE TO RELATED APPLICATION

This application is related to U.S. patent application Ser. No. 12/131,654 filed on Jun. 2, 2008, and entitled "MATERIALS FOR PARTICLE REMOVAL BY SINGLE-PHASE AND TWO-PHASE MEDIA," and to U.S. patent application Ser. No. 12/165,577, filed on Jun. 30, 2008, entitled "SINGLE SUBSTRATE PROCESSING HEAD FOR PARTICLE REMOVAL USING LOW VISCOSITY FLUID." This application is also related to U.S. patent application Ser. No. 12/262,094 filed on Oct. 30, 2008, and entitled "ACOUSTIC ASSISTED SINGLE WAFER WET CLEAN FOR SEMICONDUCTOR WAFER PROCESS," and to U.S. patent application Ser. No. 12/401,590 filed on Mar. 10, 2009, entitled "METHOD OF PARTICLE CONTAMINANT REMOVAL," and to U.S. patent application Ser. No. 12/423,759 filed on Apr. 14, 2009, entitled "APPARATUS AND METHOD FOR USING A VISCOELASTIC CLEANING MATERIAL TO REMOVE PARTICLES ON A SUBSTRATE." The aforementioned patent applications are incorporated herein by reference.

BACKGROUND

In the fabrication of semiconductor devices such as integrated circuits, memory cells, and the like, a series of manufacturing operations are performed to define features on semiconductor wafers ("wafers"). The wafers (or substrates) include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

During the series of manufacturing operations, the wafer surface is exposed to various types of contaminants. Essentially any material present in a manufacturing operation is a potential source of contamination. For example, sources of contamination may include process gases, chemicals, deposition materials, and liquids, among others. The various contaminants may deposit on the wafer surface in particulate form. If the particulate contamination is not removed, the devices within the vicinity of the contamination will likely be inoperable. Thus, it is necessary to clean contaminants from the wafer surface in a substantially complete manner without damaging the features defined on the wafer. However, the size of particulate contamination is often on the order of the critical dimension size of features fabricated on the wafer. Removal of such small particulate contamination without adversely affecting the features on the wafer can be quite difficult.

Conventional wafer cleaning methods have relied heavily on mechanical force to remove particulate contamination from the wafer surface. As feature sizes continue to decrease and become more fragile, the probability of feature damage due to application of mechanical forces on the wafer surface increases. For example, features having high aspect ratios are vulnerable to toppling or breaking when impacted by a sufficient mechanical force. To further complicate the cleaning problem, the move toward reduced feature sizes also causes a reduction in the size of particulate contamination. Particulate contamination of sufficiently small size can find its way into difficult to reach areas on the wafer surface, such as in a trench surrounded by high aspect ratio features. Thus, efficient and non-damaging removal of contaminants during modern semiconductor fabrication represents a continuing challenge to be met by continuing advances in wafer cleaning technology. It should be appreciated that the manufacturing operations for flat panel displays suffer from the same shortcomings of the integrated circuit manufacturing discussed above.

In view of the forgoing, there is a need for apparatus and methods of cleaning patterned wafers that are effective in removing contaminants and do not damage the features on the patterned wafers.

SUMMARY OF THE INVENTION

Broadly speaking, the present invention fills these needs by providing a cleaning mechanism wherein a high velocity liquid is applied to a viscoelastic material coating on a solid surface, such as a semiconductor substrate. It should be appreciated that the present invention can be implemented in numerous ways, including as a process, an apparatus, or a system. Several inventive embodiments of the present invention are described below.

In one embodiment, a method for cleaning particle contaminants from a solid surface, such as a semiconductor substrate, is provided. The method includes applying a viscoelastic material so as to coat the solid surface. The viscoelastic material exhibits liquid-like behavior during application and at least partially binds to particle contaminants that are resident on the solid surface. A liquid such as deionized water is applied at high velocity to the viscoelastic material coating. The high velocity liquid impacting the viscoelastic material causes the viscoelastic material to exhibit solid-like characteristics, and dislodges the viscoelastic material from the solid surface. As the viscoelastic material is removed from the solid surface, particle contaminants which are bound to the viscoelastic material are removed as well.

In another embodiment, a particle removal mechanism for removing particles from a solid surface of a substrate is provided. The particle removal mechanism includes a rotatable support mechanism to receive, hold, and spin the substrate within a bowl receptacle. A viscoelastic material applicator mechanism applies a layer of viscoelastic cleaning material, so as to provide a thin layer of the viscoelastic material on the solid surface. A spray jet mechanism is included to provide a high velocity liquid spray to the viscoelastic material on the solid surface, dislodging the viscoelastic material as it exhibits solid-like behavior under the application of the liquid spray. The centrifugal force resulting from the spinning of the substrate promotes removal of the liquid runoff, along with viscoelastic material and particle contaminants from the solid surface. The resulting solid surface is substantially clean while preserving the features formed on the substrate.

In another embodiment, a particle removal mechanism for cleaning a solid surface of particle contaminants is provided. The particle removal mechanism includes a carrier mechanism to hold the solid surface to be cleaned, a dispense array, a spray jet array and a rinse array. The carrier mechanism is configured to receive, hold and transport the solid surface along an axis. The dispense array is configured to supply a viscoelastic material as a coating to the solid surface. The spray jet array is configured to supply a high velocity liquid spray to the coating of viscoelastic material applied on the solid surface. The application of the liquid spray to the viscoelastic material causes the viscoelastic material to exhibit solid-like behavior, thereby facilitating its detachment from the solid surface. The rinse array is configured to provide a liquid chemical as a rinse meniscus and to remove the liquid chemical and any viscoelastic material from the solid surface.

By accessing the solid-like characteristics of the viscoelastic material, the viscoelastic material can be easily "peeled-off" leaving behind a substantially clean solid surface. The process allows thorough removal of the viscoelastic material thereby reducing the amount of contamination left behind during the cleaning process. The embodiments of the invention take advantage of the liquid-like characteristic of the viscoelastic material when applied to the solid surface, and take advantage of the solid-like characteristic when removing from the solid surface. The liquid-like characteristic provides the ability to reach into small areas while the solid-like characteristic enables easy and thorough removal of the viscoelastic material from the solid surface along with contaminant particles bound therein, making this a very simple, effective and efficient technique for cleaning the solid surface. Additionally, as the viscoelastic material is removed sufficiently well by leveraging solid-like characteristics, the problems associated with incomplete or inefficient removal with respect to liquid chemicals, such as remnant contaminants or spotting, is eliminated making this a more effective cleaning technique.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

Figure 1:
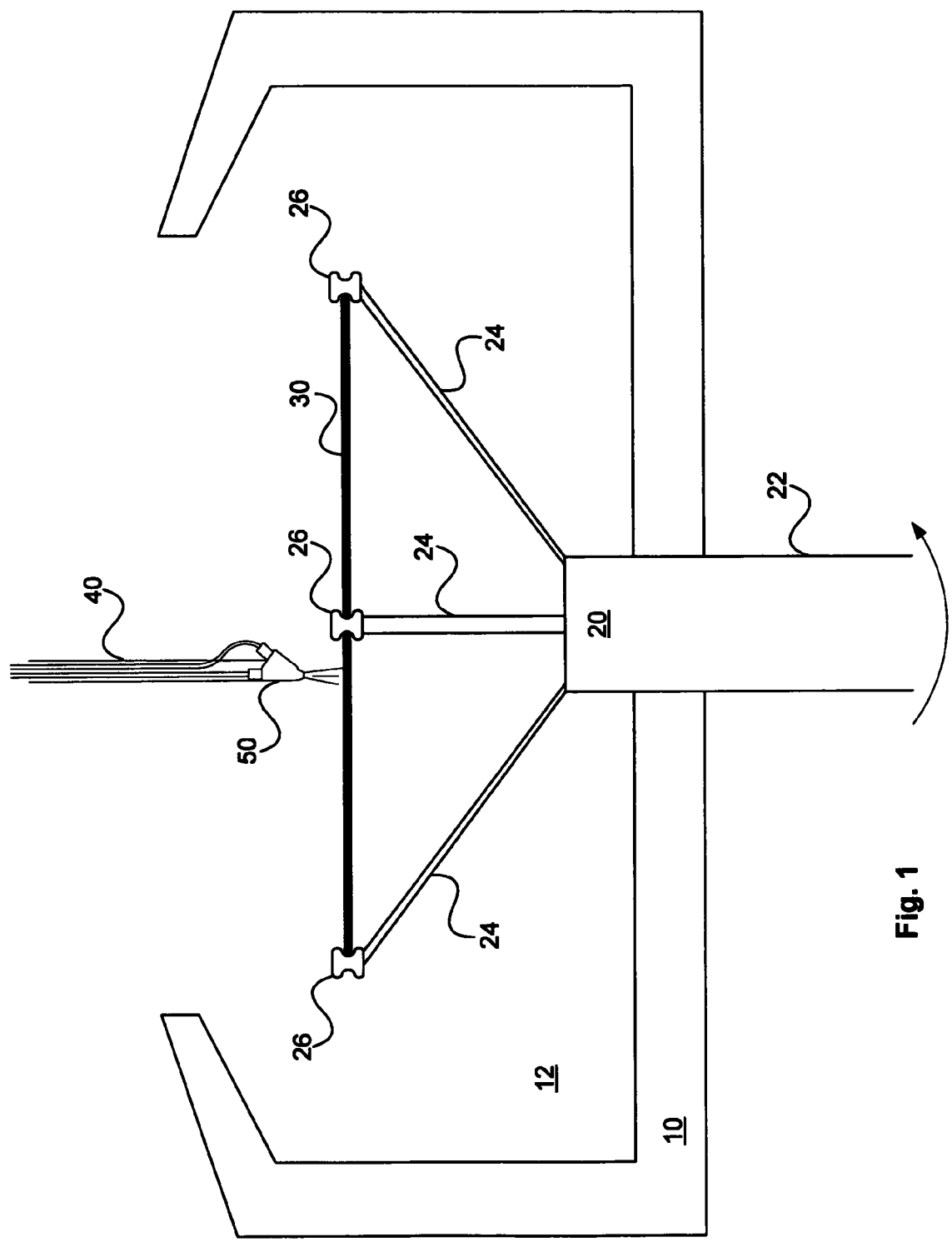
FIG. 1 illustrates a system for removing particle contaminants from a semiconductor wafer surface, in accordance with an embodiment of the invention.

Several embodiments for effectively removing particle contaminants from a solid surface are now described. It will be obvious, however, to one skilled in the art, that the present invention may be practiced without some or all of these specific details. In other instances, well known process operations have not been described in detail in order not to unnecessarily obscure the present invention.

Embodiments of the invention provide a particle removal mechanism for cleaning a solid surface using a viscoelastic material and providing a spray jet to apply a liquid at high velocity to the viscoelastic material. The viscoelastic material is selected such that the chemical structure of the material allows for at least partial binding or interaction with particle contaminants that are to be removed from the solid surface. The viscoelastic material is applied to the solid surface as a liquid; however, the time duration of the force applied by the high velocity liquid is shorter than an intrinsic characteristic time of relaxation of the viscoelastic material so as to access solid-like characteristics of the viscoelastic material. The viscoelastic material is thereby promptly removed along with particles from the solid surface while the material is still exhibiting solid-like characteristics resulting in a substantially clean solid surface. The solid-like characteristic of the viscoelastic material enables easy and thorough removal of the particle contaminants.

The embodiments of the invention provide an effective and efficient mechanism to remove particles from solid surfaces, such as silicon substrates for semiconductors, flat panel displays, solar, or imaging sensor application surfaces, by inducing and leveraging solid-like characteristics of a viscoelastic cleaning medium. Utilizing the elastic or solid-like behavior of the viscoelastic material enables easy removal of the material without damaging the features, thereby enhancing the yield of electronic devices (e.g. semiconductor devices) formed on the solid surface, such as a semiconductor substrate. The embodiments take advantage of both liquid-like characteristics and solid-like characteristics of the viscoelastic material. The liquid-like characteristic enables the viscoelastic material to be dispensed easily and to access difficult-to-reach areas of the substrate that may contain particle contaminants, thereby ensuring a substantially clean solid surface. The solid-like characteristic enables easy removal of the material resulting in a substantially clean solid surface. It is well known in the art that many of the contaminants on a substrate are left behind by chemicals used in fabrication and cleaning processes. However, by exploiting the solid-like characteristics of a viscoelastic cleaning material, the embodiments ensure thorough removal of the viscoelastic material thereby significantly reducing the amount of contaminants, such as viscoelastic material itself, left behind by the cleaning process. Thus, the embodiments provide an effective and efficient cleaning process.

It should be noted that an external force may be rapidly applied (e.g. via a spray jet) during the viscoelastic material dispense process, between the viscoelastic material dispense process and rinse process, during the rinse process, or a combination of the former. The particle removal concept of the present embodiments effects the elastic or solid-like behavior of the viscoelastic material, which occurs when the application time of the force is less than an intrinsic characteristic time of relaxation of the material. The force is sufficiently rapid so as to prevent the material from relaxing and, hence, from exhibiting liquid-like characteristics. Instead, the force promotes elastic or solid-like behavior in the viscoelastic material. When the elastic behavior is dominant in the viscoelastic material, the force transmitted from the viscoelastic material to the particle contaminant on the solid surface is substantially larger than would be the case if viscous-type behavior were dominant. The result is that less force is required to efficiently overcome particle-to-surface adhesion and to successfully detach the particles from the solid surface. Once the particle-to-surface adhesion has been overcome, a rinsing process removes the material along with the particle from the solid surface. As can be seen, the particle removal can occur anytime after dispensing of the viscoelastic material but before completion of the rinsing process.

The viscoelastic material is selected such that the chemical structure associated with the viscoelastic material enables at least partial binding or interaction with the particle. In some embodiments, the viscoelastic material may be a long-chain polymer. When a rapid force is applied to the viscoelastic material, the compounds, such as polymers in the long polymer chains, rearrange to form structures exhibiting solid-like characteristics so that the material can be easily peeled away from the solid substrate. The viscoelastic material is not restricted to long-chain polymers but may include suspensions, worm-like micelles, surfactants, magneto/electro-rheological solutions, and other viscoelastic solids such as rubbers, gels, and adhesives, as well as combinations of the former.

With the above general understanding of the application of a rapid force to access solid-like characteristics of a viscoelastic cleaning material, different embodiments of the invention will now be described in detail with reference to the various drawings.

FIG. 1 illustrates a system for removing particle contaminants from a semiconductor wafer surface, in accordance with an embodiment of the invention. A bowl 10 defines a chamber 12 for receiving a wafer 30. The wafer 30 is securely held by a support 20. The support 20 includes a shaft 22 which extends into chamber 12, as well as a plurality of arms 24 which extend from the shaft 22. Rotation of the shaft is effected by a mechanism known in the art, such as an electric motor (not shown). The plurality of arms may include three or more arms, as are necessary for securing the wafer. Pads 26 are attached to the ends of arms 24, providing gripping surfaces which contact the edge of wafer 30. In one embodiment, the pads 26 comprise static rollers. In other embodiments, the pads 26 may comprise different forms and materials, provided that the pads 26 securely grip the wafer 30. A spray jet 50 is configured to apply a liquid at high velocity to the wafer 30. The spray jet 50 is attached to an arm 40 which is configured to move the spray jet 50 across the surface of the wafer 30. In one embodiment, the arm 50 is configured to move the spray jet from a position proximate to the center of the wafer to a position proximate to the edge of the wafer. As the spray jet applies liquid to the surface of the wafer 30, the rotation of the wafer causes the liquid to migrate towards the edge of the wafer and eventually flow off of the wafer into the bowl 10. The liquid may then be channeled for disposal or recycling. In one embodiment of the invention, the spray jet 50 is angularly positioned so that the liquid spray strikes the surface of the wafer 30 at an approximately perpendicular angle. In other embodiments of the invention, the spray jet 50 is configured at various angles, such that the liquid spray strikes the surface of the wafer 30 at various angles of incidence. In one embodiment, the angle of incidence is oriented such that the liquid spray is angled towards the edge of the wafer 30, thereby aiding the removal of the liquid from the wafer 30.

Figure 2:
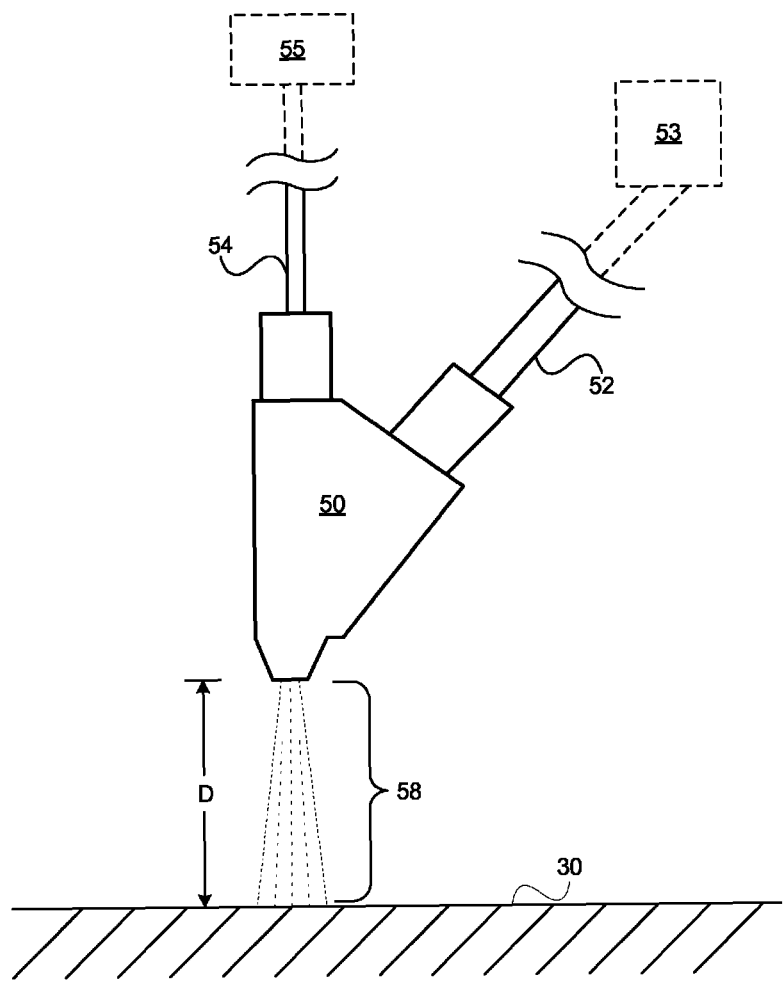
FIG. 2 illustrates a side view of a spray jet, in accordance with an embodiment of the invention.

FIG. 2 illustrates a side view of a spray jet 50, in accordance with an embodiment of the invention. The spray jet 50 includes a carrier gas input 52 for receiving a carrier gas from a carrier gas source 53, and a liquid input 54 for receiving a liquid from a liquid source 55. The liquid is combined with the carrier gas and ejected through the spray jet nozzle 56, forming liquid spray 58. The volumetric flow rate of the carrier gas is substantially greater than the volumetric flow rate of the liquid, so that comparatively small amounts of liquid may be accelerated to high velocities by introducing the liquid into the carrier gas. The specific mechanisms for combining a liquid and a carrier gas in a spray jet are known in the art. The carrier gas may be any suitable gas, preferably an inert gas, such as nitrogen; the liquid may be any suitable liquid for cleaning, such as deionized water. The spray jet 50 thus produces a high velocity liquid spray 58 for cleaning purposes. As the distance D of the spray jet 50 from the wafer 30 increases, so the dispersion of the liquid spray 58 increases. This may be desirable as it provides an increased simultaneous area of coverage by the liquid spray 58, thereby increasing efficiency. However, greater dispersion also results in lower density of liquid striking the surface, and consequently a lower cleaning energy per unit area. Moreover, increased distance D causes a decrease in the velocity of the liquid spray 58 due to airborne deceleration. However, a decreased velocity may be desirable to a certain extent in order to avoid causing damage to surface structures on the wafer 30. In view of these considerations, several factors may be fine-tuned to achieve optimal cleaning characteristics of the liquid spray 58, including the following non-exhaustive list of factors: nozzle type, nozzle size, flow rate of the carrier gas, flow rate of the liquid, distance of the spray jet from the wafer, angle of incidence of the liquid spray relative to the wafer. In one embodiment of the invention, the spray jet 50 is adjusted such that the liquid spray 58 achieves a velocity approximately in the range of 10 meters per second (m/s) to 100 m/s. In other embodiments of the invention, the velocity of the liquid spray 58 may be greater than 100 m/s or less than 10 m/s. In one embodiment of the invention, the flow rate of the liquid is approximately 300 mL/minute or less; in other embodiments of the invention, the flow rate of the liquid may be greater than approximately 300 mL/minute. In one embodiment of the invention, the flow rate of the carrier gas is approximately 50 SLM or less; in other embodiments of the invention, the flow rate of the carrier gas may be greater than approximately 50 SLM.

Figure 3A:
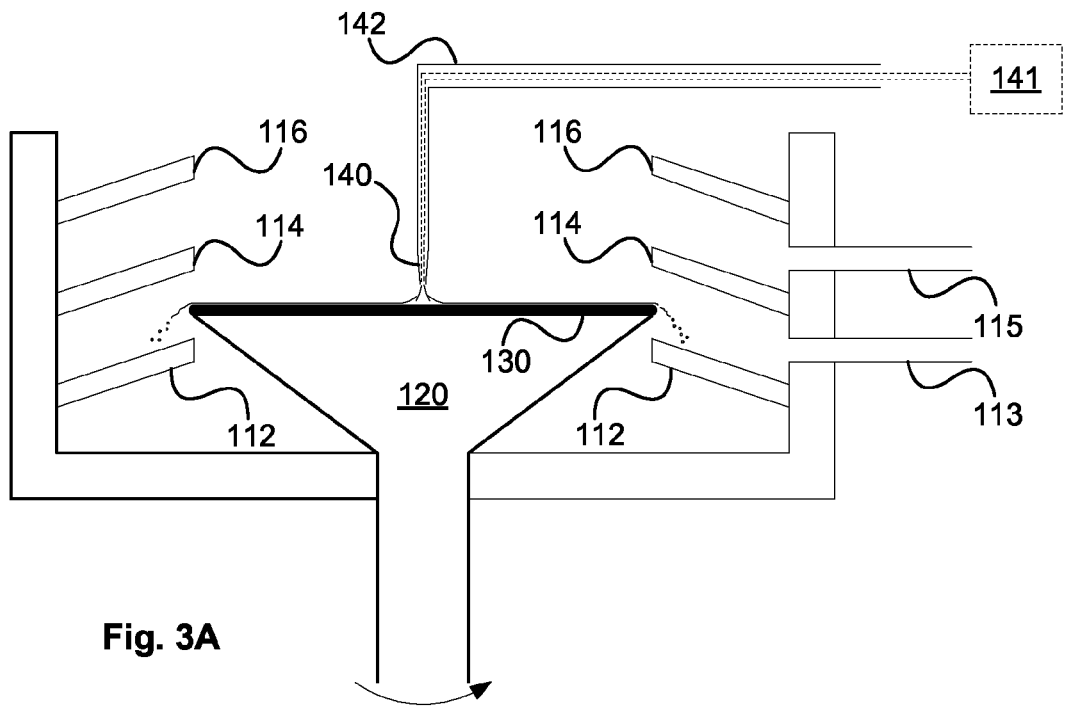
FIGS. 3A and 3B illustrate a system for removing particle contaminants from a semiconductor wafer surface, in accordance with an embodiment of the invention.
Figure 3B:
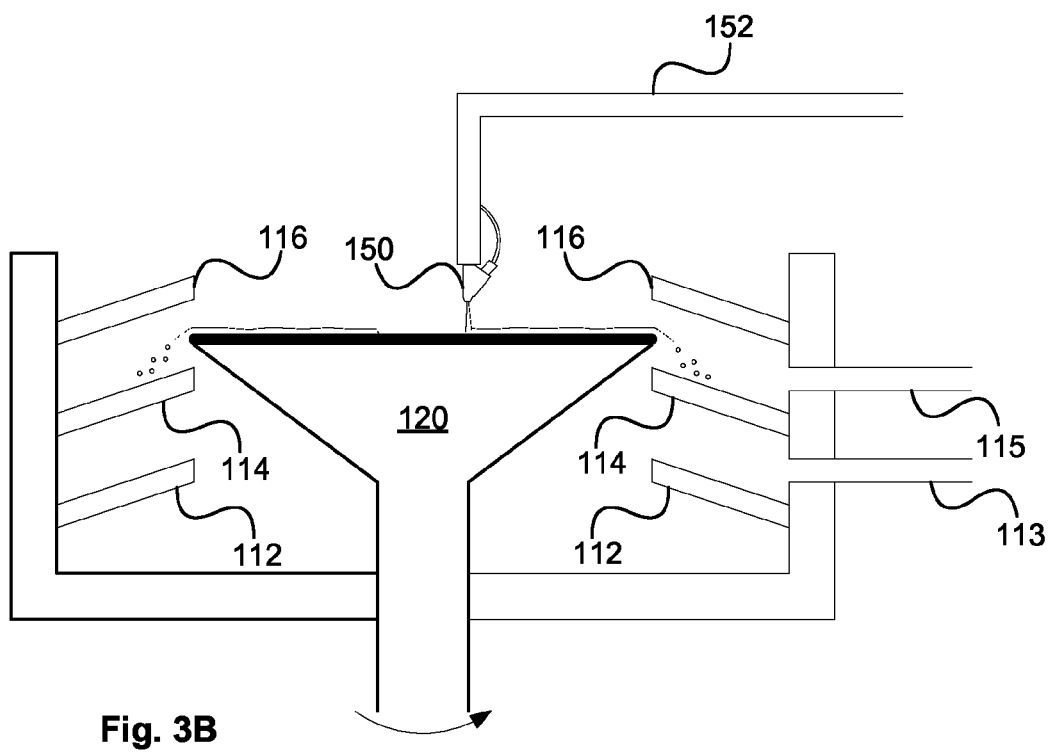

FIGS. 3A and 3B illustrate a system for removing particle contaminants from a semiconductor wafer surface, in accordance with an embodiment of the invention. A bowl 110 includes a number of annular flanges 112, 114, and 116, which define various process positions. A first process position is defined by the annular flanges 112 and 114; and a second process position is defined by the annular flanges 114 and 116. A wafer 130 is securely held by a support 120. The support 120 is configured to move up and down, so as to position the wafer 130 at the various process positions, and also configured to rotate the wafer 130 at various speeds. In FIG. 3A, the support 120 is positioned so as to place the wafer 130 at the first process position, in between annular flanges 112 and 114. A dispense head 140 is coupled to an arm 142. The dispense head 140 receives a viscoelastic material from a viscoelastic material source 141 and dispenses the viscoelastic material onto the wafer 130, as the wafer 130 is spun by the support 120. In one embodiment of the invention, the viscoelastic material comprises a polymeric material. In one embodiment of the invention, the support 120 spins at approximately 10 rpm; in other embodiments the support 120 spins at speeds greater than 10 rpm or less than 10 rpm. In one embodiment of the invention, the viscoelastic material is dispensed at the center of the wafer, and centrifugal forces cause the viscoelastic material to spread towards the edges of the wafer 130. In another embodiment of the invention, the arm 142 is configured to move the dispense head 140 across the surface of the wafer 130 as the viscoelastic material is dispensed onto the wafer 130. The viscoelastic material thus forms a layer on the wafer 130. The viscoelastic material at least partially binds to contaminant particles on the surface of wafer 130. Excess viscoelastic material falls off the edges of the wafer 130 into the space between the annular flanges 112 and 114. This excess material is removed from the bowl via duct 113, which may be connected to a pumping mechanism as is known in the art. The excess viscoelastic material may be recycled for further use, or otherwise discarded. After a layer of viscoelastic material is dispensed onto the wafer 130, the support 120 is moved to the second process position, situated between annular flanges 114 and 116, as shown in FIG. 3B. At this position, a spray jet 150, coupled to arm 152, applies a liquid spray to the wafer 130, as the wafer 130 is spun by the support 120. In one embodiment of the invention, the support 120 is spun at approximately 500 rpm. In other embodiments of the invention, the support 120 spins at speeds less than 500 rpm or greater than 500 rpm. The liquid spray impacts the coating of viscoelastic material, thereby dislodging the viscoelastic material along with contaminant particles which are bound to it. Centrifugal forces cause the dislodged viscoelastic material along with the liquid from the liquid spray to migrate towards the edges of the wafer 130, eventually falling off into the space between annular flanges 114 and 116, and collected for disposal via duct 115. As the viscoelastic material is removed from the wafer 130, the spray jet is moved so as to continue directing the liquid spray at the viscoelastic material. In one embodiment of the invention, the arm 152 is configured to move the spray jet 150 from a position proximate to the center of the wafer to a position proximate to the edge of the wafer 130.

Figure 4:
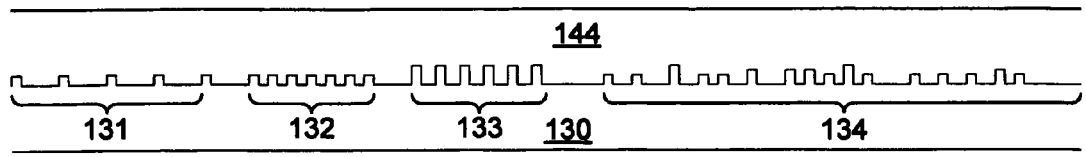
FIG. 4 illustrates a cross-sectional view of a semiconductor substrate surface coated with a viscoelastic material, in accordance with an embodiment of the invention.

FIG. 4 illustrates a cross-sectional view of the wafer 130 with a layer of viscoelastic material 144, in accordance with an embodiment of the invention. Various features shown on the surface of wafer 130 are not drawn to scale, but are presented for illustrative purposes only. As is known in the art, a semiconductor substrate may include various physical features. There may be areas of relatively low density of features 131, or areas having a greater density of features 132. Some areas may include features having high aspect ratios 133. Some features may be patterned or there may be randomly distributed features 134. The presence of such features creates contours on the surface of a wafer 130 which are prone to retaining contaminant particles. Moreover, densely spaced features and/or features having a high aspect ratio can render contaminant particles located between such features difficult to access, let alone remove. However, the viscoelastic cleaning material is able to penetrate in between such features and at least partially bind to particle contaminants retained therein. Under normal circumstances, the cleaning energy required to remove particle contaminants from such difficult-to-reach locations would be exceedingly high, such that the amount of energy required would potentially damage certain features in the process. However, because the viscoelastic material is capable of binding to contaminant particles, the amount of cleaning energy required to remove particles is only that amount of energy necessary to remove the viscoelastic material. And because the viscoelastic material behaves as a solid when a force is applied with sufficient velocity, significant portions of the viscoelastic material may be dislodged from the surface of the wafer at relatively low energy levels, thereby preventing damage to the features present on the wafer surface.

Figure 5:
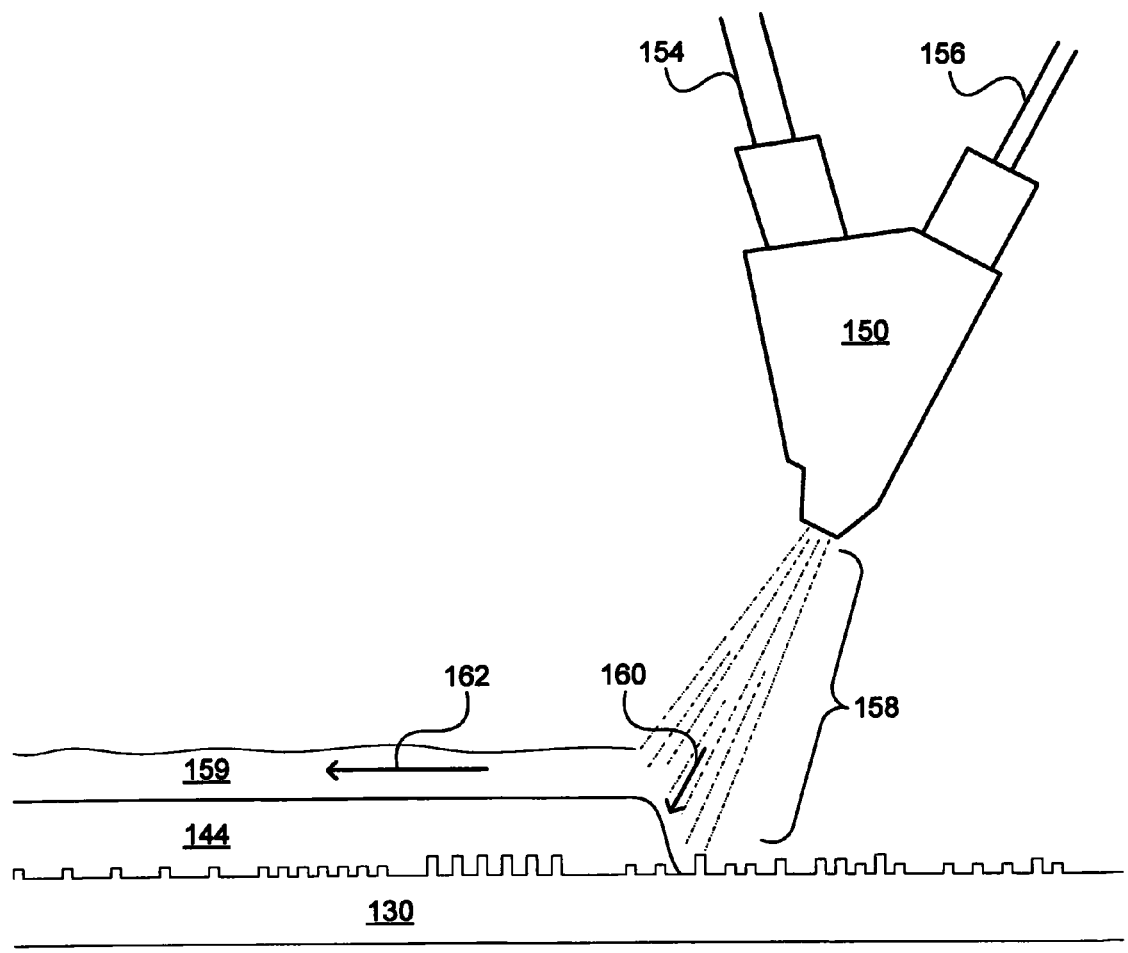
FIG. 5 illustrates a spray jet applying a liquid to a viscoelastic material coating, in accordance with an embodiment of the invention.

FIG. 5 illustrates the application of a liquid spray 158 to a viscoelastic layer 144 on the wafer 130. The spray jet 150 is configured to receive a carrier gas via carrier gas input 154 and a liquid via liquid input 156. In one embodiment of the invention, the carrier gas is nitrogen, and the liquid is deionized water. The flow rate of the carrier gas is substantially greater than the flow rate of the liquid, such that the carrier gas accelerates the liquid to a high velocity. The resultant liquid spray 158 is directed towards the center-facing edge of the viscoelastic layer, thus directly impacting the viscoelastic material. The impact of the liquid spray upon the viscoelastic layer exerts a direct force upon the viscoelastic layer, as represented by the arrow 160. The application of this force causes the viscoelastic material to exhibit solid-like properties, enabling removal of significant portions of the viscoelastic layer while utilizing relatively low amounts of energy. Therefore, even though the liquid spray 158 may directly impact surface features of the wafer 130, especially after local viscoelastic material has been removed, the energy level and time of exposure are limited to such an extent that damage to the surface features is minimized. Additionally, because the wafer 130 is being spun, centrifugal forces propel the runoff 159, which includes both liquid and portions of viscoelastic material which have detached from the wafer 130, towards the edges of the wafer 130. These centrifugal forces cause the runoff 130 to produce a tangential force, represented by arrow 162, which acts upon the top of the viscoelastic layer 144. Furthermore, in one embodiment of the invention, the spray jet 150 may be configured so as to direct the liquid spray 158 at an incident angle towards the edge of the wafer 130. In such an embodiment, the liquid spray 158 provides an additional tangential force which helps to propel the runoff 159 towards the edge of the wafer 130.

It is recognized that in some embodiments of the invention, the viscoelastic material may be miscible in the liquid which is being applied by the spray jet 150. Thus, as runoff 159 is produced and passes over the viscoelastic layer 144, there may be mixing of the two, which effectively reduces the thickness of the viscoelastic layer where such mixing occurs. This effect may become more pronounced at the edges of the wafer 130, as these areas receive the cumulative runoff from the interior areas of the wafer 130. (This assumes that the spray jet 150 is operated so as to apply liquid spray 158 from the center to the edges of wafer 130.) The result is non-uniformity of the viscoelastic layer 144, which is problematic for optimizing the parameters of the spray jet 150. It is desirable to operate the spray jet 150 so as to apply the liquid spray 158 in a uniform manner to the viscoelastic layer 144, applying the liquid spray 158 to a unit area at a sufficient velocity and for a sufficient length of time to dislodge the viscoelastic layer. However, it is also desirable to minimize the potential for damage to surface features, and to minimize the length of time required in order to increase the efficiency of the process. If the viscoelastic layer 144 exhibits non-uniformity, due to miscibility of the viscoelastic material with the liquid or otherwise, then different portions of the viscoelastic layer 144 will require different velocities of liquid and/or durations of exposure to the liquid spray 158. In order to avoid such issues arising from non-uniformity of the viscoelastic layer 144, it is desirable to operate the spray jet so as to apply the liquid spray 158 to the entirety of the wafer 130 in a short time duration, thereby reducing the amount of time available for mixing of the viscoelastic layer with the runoff to occur. In another embodiment of the invention, the spray jet is operated "outside-in," first applying the liquid spray to the edges of the wafer, and then moving progressively inward towards the center. Meanwhile, the centrifugal force generated by the rotation of the wafer continues to propel the runoff towards the edges of the wafer. Thus, the runoff does not affect portions of the viscoelastic layer which have not received application of the liquid spray.

Figure 6:
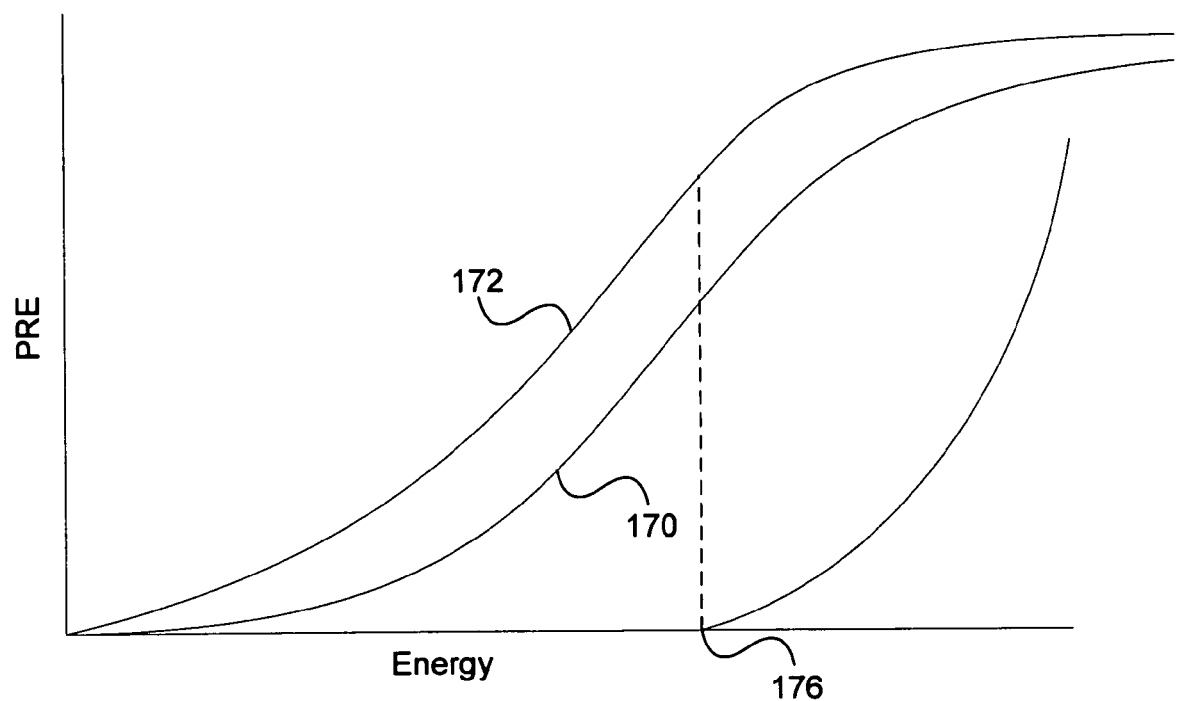
FIG. 6 illustrates a graph showing particle removal efficiency versus energy, in accordance with an embodiment of the invention.

FIG. 6 illustrates a graph depicting particle removal efficiency (PRE) versus energy. The curve 170 illustrates PRE vs. energy for a spray jet alone. At very low energy levels, there is insufficient energy to remove a significant portion of contaminant particles. As energy level is increased, the PRE increases, until at very high energy levels the PRE begins to approach the maximum PRE (complete removal of all contaminant particles). However, these higher energy levels are accompanied by increasing levels of damage to surface features, as illustrated by curve 174, which depicts damage level as a function of energy. Curve 172 illustrates PRE vs. energy for a spray jet operated in conjunction with a layer of viscoelastic material applied to a wafer surface. As compared to the spray jet alone, the use of a viscoelastic material enables higher PRE at equivalent energy levels. Considering one example more specifically, energy level 176 represents the damage threshold, as energy levels greater than energy level 176 will produce damage to the features on the wafer surface. Thus, if one wishes to avoid causing damage to the wafer, then this energy level 176 represents the maximum permissible operating energy level. At this energy level, the PRE of operating a spray jet in conjunction with an applied viscoelastic cleaning material is higher than simply operating a spray jet alone. Thus, by utilizing a spray jet in conjunction with a viscoelastic cleaning material, it is possible to achieve cleaner wafer surfaces while simultaneously minimizing unwanted damage to surface features, thereby increasing the yield of chips per wafer.

Figure 7A:
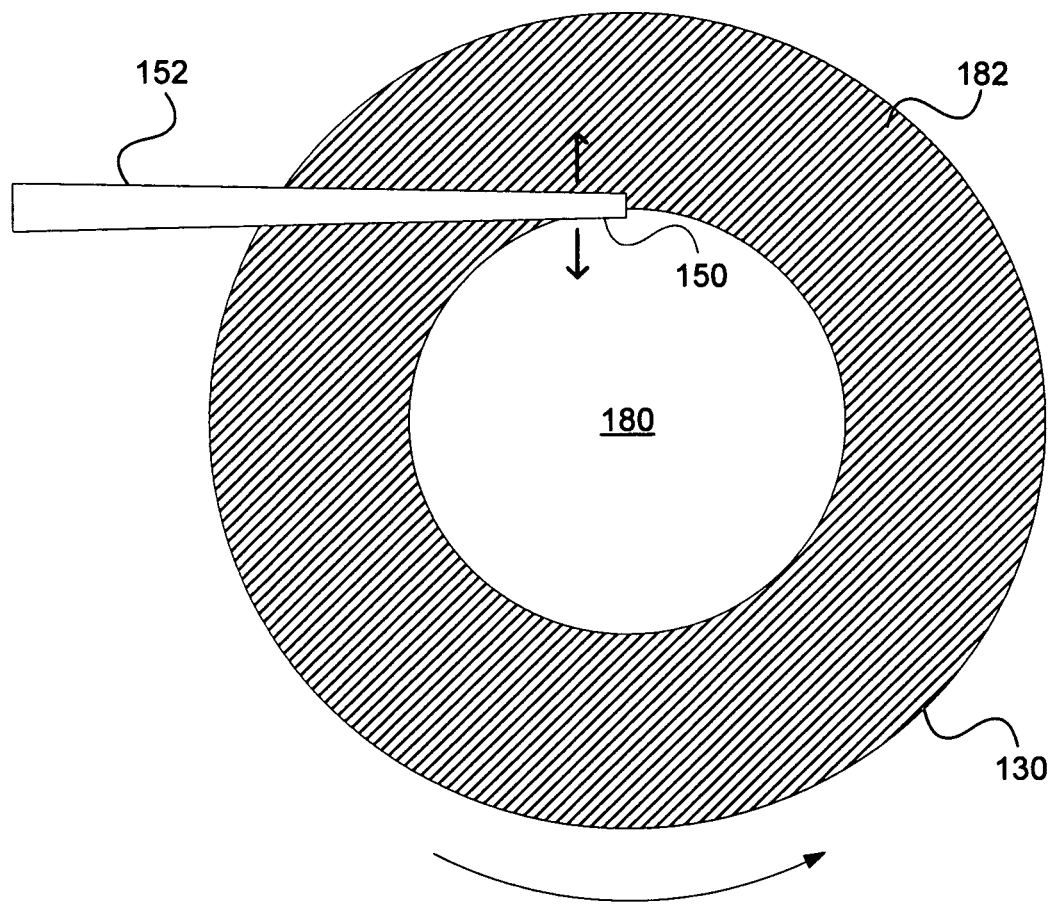
FIG. 7A illustrates a top view of a system for removing particle contaminants from a solid surface, in accordance with an embodiment of the invention.

FIG. 7A illustrates a top view of a system for cleaning contaminant particles from a wafer 130, in accordance with the embodiment of the invention discussed with reference to FIG. 3B. The spray jet 150 applies a liquid spray to the edge of the viscoelastic layer 182 on the wafer 130, as the wafer 130 is spun. As the viscoelastic layer is removed along with particle contaminants bound to the viscoelastic material, a clean area 180 is formed. The arm 152 is configured to move the spray jet 152 from a position proximate to the center of wafer 130 to a position proximate to the edge of wafer 130. Assuming a constant spin rate of the wafer 130, the linear velocity of a point on the wafer is increased as the distance from the center increases. Therefore, to ensure adequate application of the liquid spray to the viscoelastic later 182, in one embodiment of the invention, the arm 152 is configured to move the spray jet 150 from a position proximate to the center of the wafer 130 to a position proximate to the edge, the movement of the spray jet 150 occurring at a decreasing rate so as to provide adequate exposure of different portions of the viscoelastic layer at different radii from the center of the wafer 130 to the liquid spray.

Figure 7B:
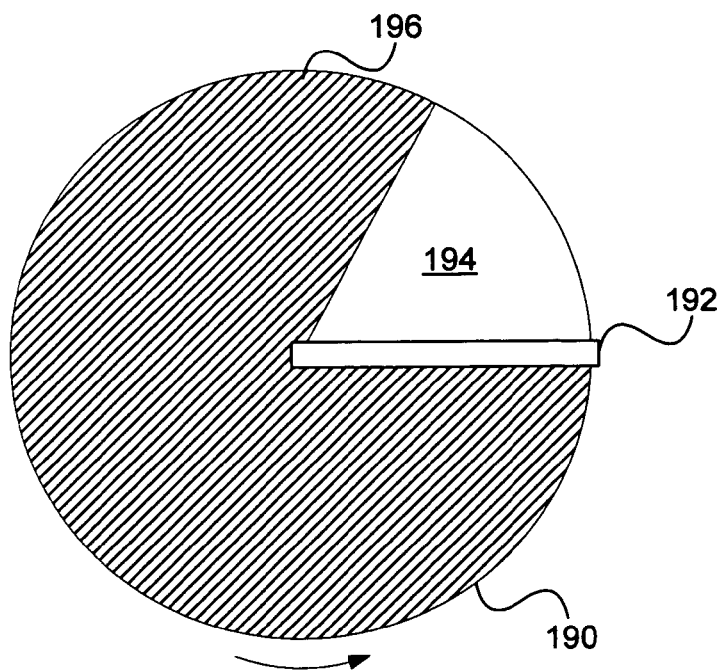
FIG. 7B illustrates a top view of a system for removing particle contaminants from a solid surface, in accordance with an embodiment of the invention.

FIG. 7B illustrates a top view of a system for cleaning contaminant particles from a wafer 190, in accordance with an embodiment of the invention. The wafer 190 as shown has been coated with a viscoelastic cleaning material, thus forming a viscoelastic layer 196. A spray jet array 192 simultaneously applies a liquid at high velocity to the viscoelastic material across a radius of the wafer 190 as the wafer 190 is spun. In one embodiment of the invention, the spray jet array 192 comprises a number of spray jet nozzles, the spray jet nozzles providing overlapping coverage so as to produce a simultaneous application of liquid spray across a radius of the wafer 190. As the viscoelastic material is removed from the wafer 190, a clean area 194 is formed. In one embodiment of the invention, only one rotation of the wafer 190 is required to remove the viscoelastic layer 196 from the wafer 190. In other embodiments of the invention, multiple rotations of the wafer 190 are required.

Figure 7C:
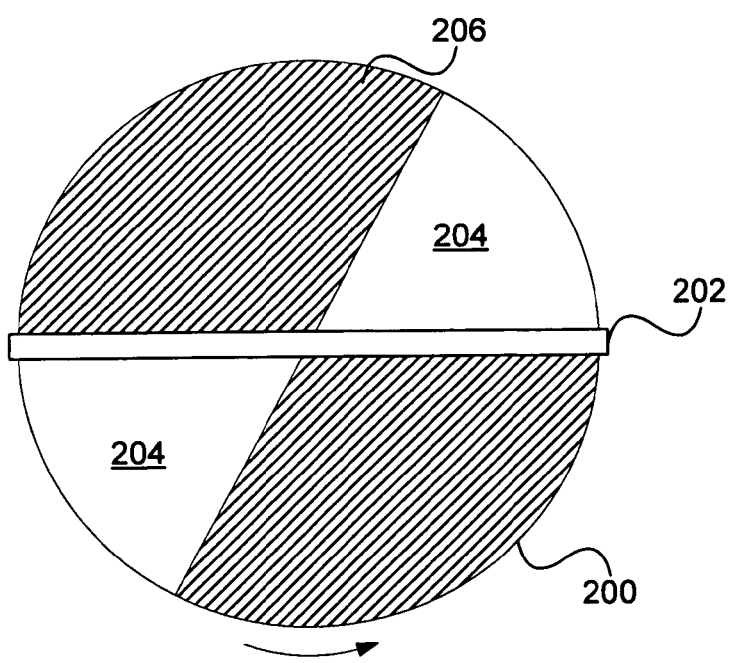
FIG. 7C illustrates a top view of a system for removing particle contaminants from a solid surface, in accordance with an embodiment of the invention.

FIG. 7C illustrates a top view of a system for cleaning contaminant particles from a wafer 200, in accordance with an embodiment of the invention. The wafer 200 as shown has been coated with a viscoelastic cleaning material, thus forming a viscoelastic layer 206. A spray jet array 202 simultaneously applies a liquid at high velocity to the viscoelastic material across a diameter of the wafer 200 as the wafer 200 is spun. In one embodiment of the invention, the spray jet array 202 comprises a number of spray jet nozzles, the spray jet nozzles providing overlapping coverage so as to produce a simultaneous application of liquid spray across a diameter of the wafer 200. As the viscoelastic material is removed from the wafer 200, a clean area 204 is formed. In one embodiment of the invention, only one rotation of the wafer 200 is required to remove the viscoelastic layer 206 from the wafer 200. In other embodiments of the invention, multiple rotations of the wafer 200 are required.

Figure 8:
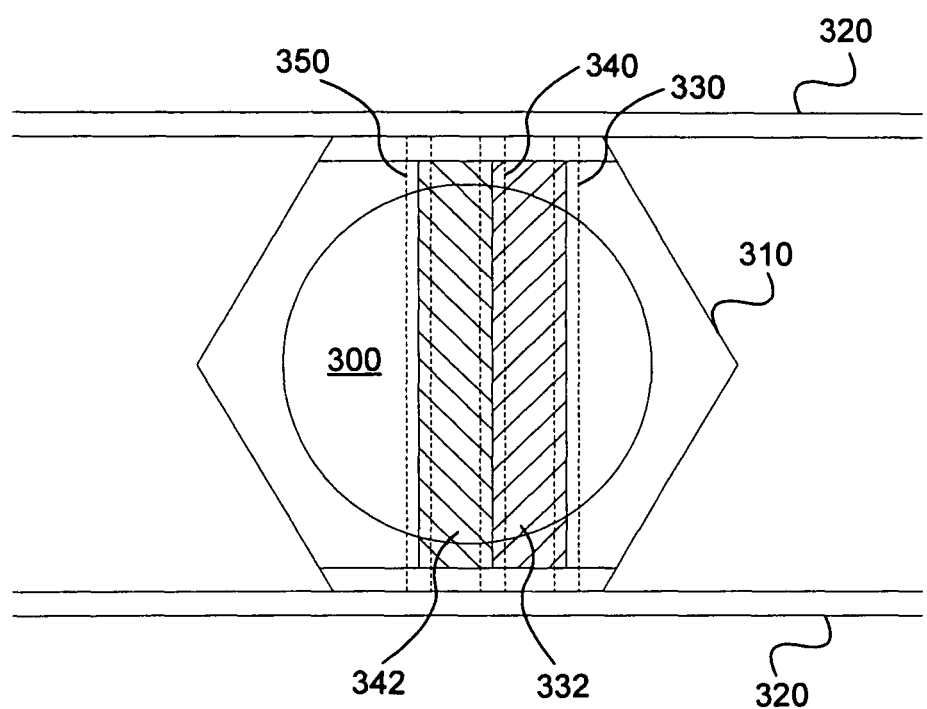
FIG. 8 illustrates a top view of a system for removing particle contaminants from a solid surface, in accordance with an embodiment of the invention.

FIG. 8 illustrates a top view of a system for removing particle contaminants from a solid surface, in accordance with an embodiment of the invention. A solid surface, such as a wafer 300, is supported by a carrier 310. The carrier 310 is configured to move in a linear direction along tracks 320. The tracks 320 may comprise conveyors or other mechanisms for providing linear movement of the carrier 310 as are known in the art. As the carrier 310 is moved along the tracks 320, a number of process arrays indicated by reference numbers 330, 340, and 350 act upon the wafer 300. More specifically, dispense array 330 comprises a linear array of dispense heads for dispensing a viscoelastic cleaning material onto the surface of wafer 300. The dispense array 330 provides simultaneous coverage of a width at least the diameter of the wafer 300. The viscoelastic material exhibits liquid-like behavior during this dispensation process. As the wafer 300 is moved past the dispense array 330, a region 332 is formed wherein the wafer 300 is coated by a layer of viscoelastic material. The viscoelastic material at least partially binds to contaminant particles on the surface of the wafer 300. Spray jet array 340 comprises a linear array of spray jets which simultaneously applies a high velocity liquid spray across a width at least the diameter of the wafer 300. The high velocity of the liquid impacts the layer of viscoelastic material, causing it to exhibit solid-like behavior, such that the viscoelastic material is dislodged from the surface of the wafer 300. As the viscoelastic material is dislodged, particle contaminants which are bound to the material are removed from the surface of the wafer 300.

As the wafer 300 is moved past the spray jet array 340, a region 342 is formed containing dislodged portions of the viscoelastic material along with any bound particle contaminants, as well as runoff from the liquid spray. Rinse array 350 comprises a linear array of rinse and vacuum mechanisms, for simultaneously rinsing and removing the viscoelastic material and the liquid runoff of region 342 across a width at least the diameter of the wafer 300.

Figure 9A:
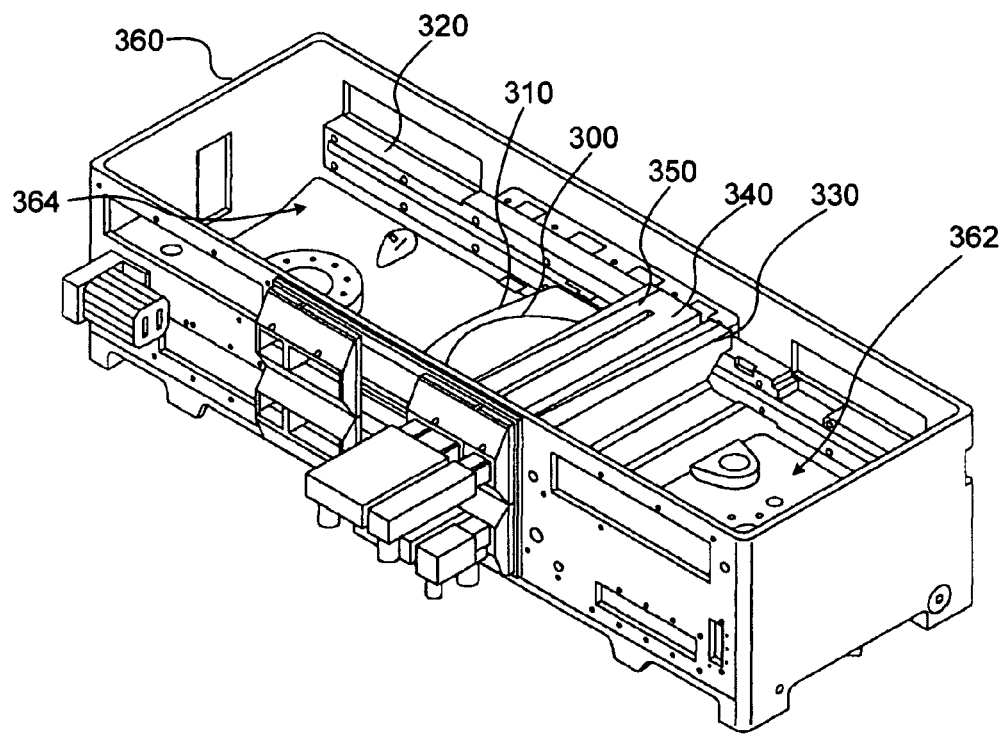
FIG. 9A illustrates a perspective view of a system for removing particle contaminants from a solid surface, in accordance with an embodiment of the invention.

FIG. 9A illustrates a perspective view of a process unit 360, in accordance with the embodiment of the invention described with reference to FIG. 8. Process unit 360 includes a loading stage 362, wherein a wafer 300 is loaded to a carrier 310. The carrier 310 is moved along tracks 320, thus passing beneath the process arrays 330, 340 and 350. As described more specifically above, dispense array 330 dispenses a layer of viscoelastic cleaning material onto the wafer 300; spray jet array 340 applies a high velocity liquid spray to the layer of viscoelastic material; and rinse array 350 rinses and vacuums the viscoelastic material and liquid runoff from the wafer. When the carrier 310 and the wafer 300 have completed passage through the various process arrays, the wafer is then unloaded from the process unit 360 at the unloading stage 364.

Figure 9B:
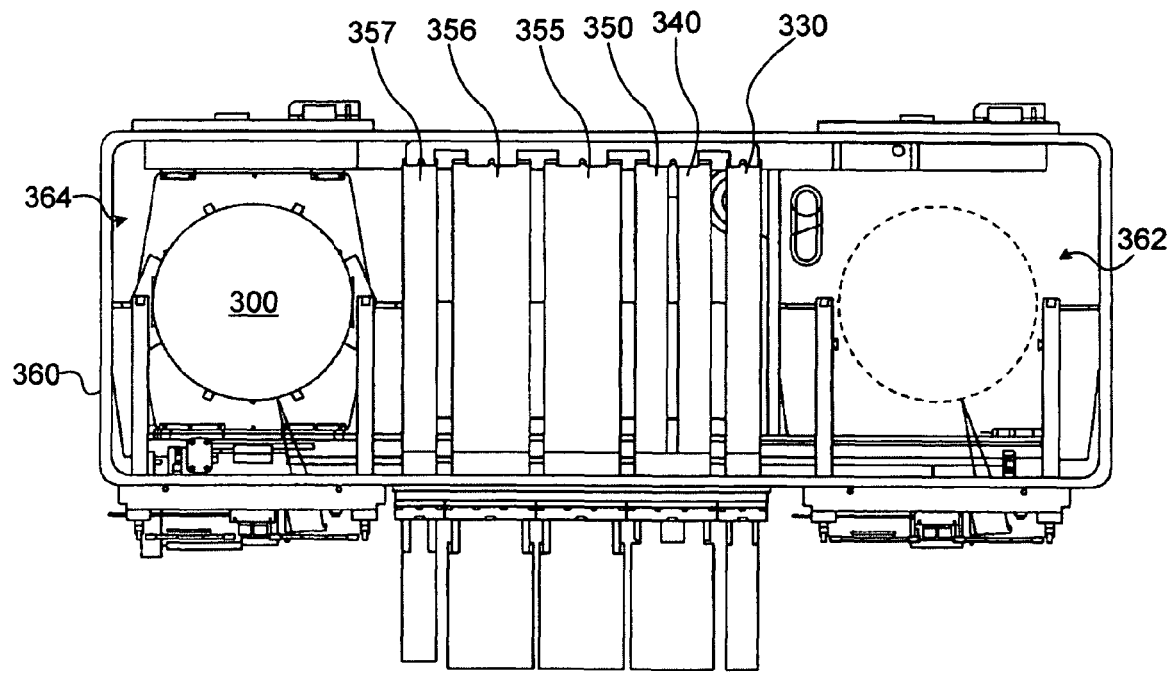
FIG. 9B illustrates a top view of a system for removing particle contaminants from a solid surface, in accordance with an embodiment of the invention.

FIG. 9B illustrates a top view of the process unit 360, including additional process arrays 355, 356, and 357, in accordance with an embodiment of the invention. These additional process arrays may perform additional processes, such as chemical applications, rinse processes, etc. The process arrays 355, 356, and 357 may be applied as a matter of course, or as optional steps in combination with the cleaning procedure carried out by process arrays 330, 340, and 350.

Figure 10A:
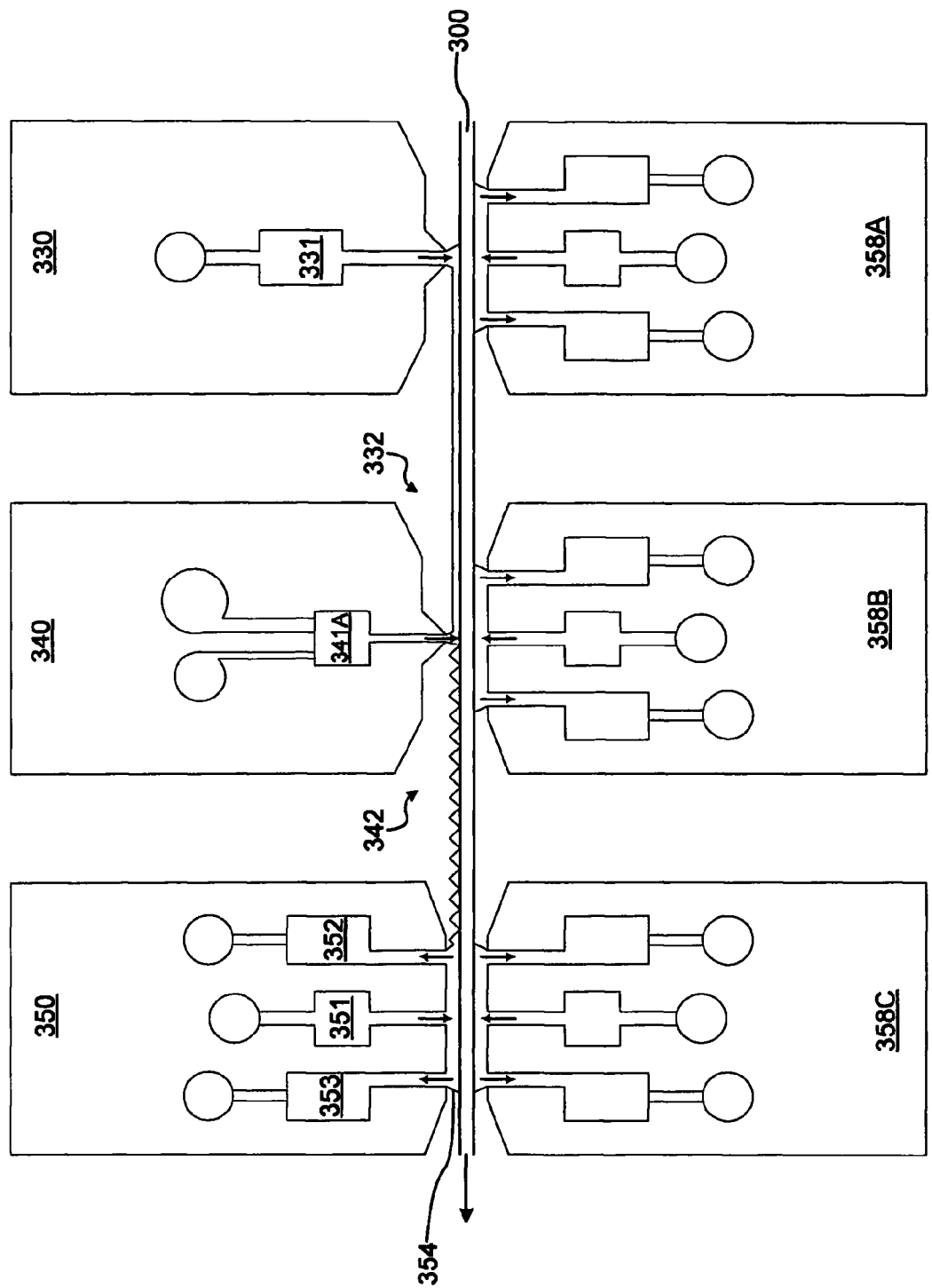
FIG. 10A illustrates a cross-section view of a system for removing particle contaminants from a solid surface, in accordance with an embodiment of the invention.

FIG. 10A illustrates a cross-sectional view of the process arrays 330, 340, and 350. As the wafer 300 is moved past the process arrays 330, 340, and 350, various operations are performed in accordance with an embodiment of the present invention. The dispense array 330 includes a linear array of dispense heads 331 to apply a viscoelastic cleaning material to the wafer 300. The dispense heads 331 may comprise various types of dispensers as are known in the art. One example of a linear array of dispense heads is disclosed in U.S. patent application Ser. No. 12/165,577, the disclosure of which is incorporated by reference. The dispensation of viscoelastic material onto the wafer 300 yields a region 332 wherein the wafer 300 is coated with a viscoelastic layer. The viscoelastic material exhibits liquid-like behavior, and at least partially binds to particle contaminants on the surface of the wafer 300. As the wafer 300 is moved, the viscoelastic layer is exposed to a high velocity liquid spray from the spray jet array 340. The spray jet array 340 includes a linear array of spray jets 341A. The spray jets 341A utilize a carrier gas (e.g. nitrogen) to accelerate a liquid (e.g. deionized water) to a high velocity. The volumetric flow rate of the gas is substantially greater than the volumetric flow rate of the liquid. The force of the liquid spray acting upon the viscoelastic layer causes the viscoelastic material to exhibit solid-like behavior, dislodging it from the wafer 300. A resulting region 342 includes both the dislodged viscoelastic material in combination with the runoff from the liquid spray. As the wafer is moved, this region is exposed to the rinse array 350. The rinse array 350 utilizes a rinse meniscus 354, formed by the application of a rinse liquid and simultaneous adjacent vacuum suction. The rinse liquid is dispensed by a linear array of rinse liquid dispense heads 351 onto the wafer 300. Simultaneously, vacuum force is provided by a linear array of leading vacuum heads 352 and a linear array of trailing vacuum heads 353. Opposing arrays 358A-C provide opposing forces to the process arrays 330, 340, and 350, thereby helping to support and stabilize the wafer 300 as it is moved through the various process stages. The opposing arrays 358A-C as shown are similar to the rinse array 350. In alternative embodiments of the invention, the opposing arrays 358A-C may comprise other types of process arrays, including a dispense array and spray jet array so as to provide a similar cleaning process to the other side of the wafer 300.

Figure 10B:
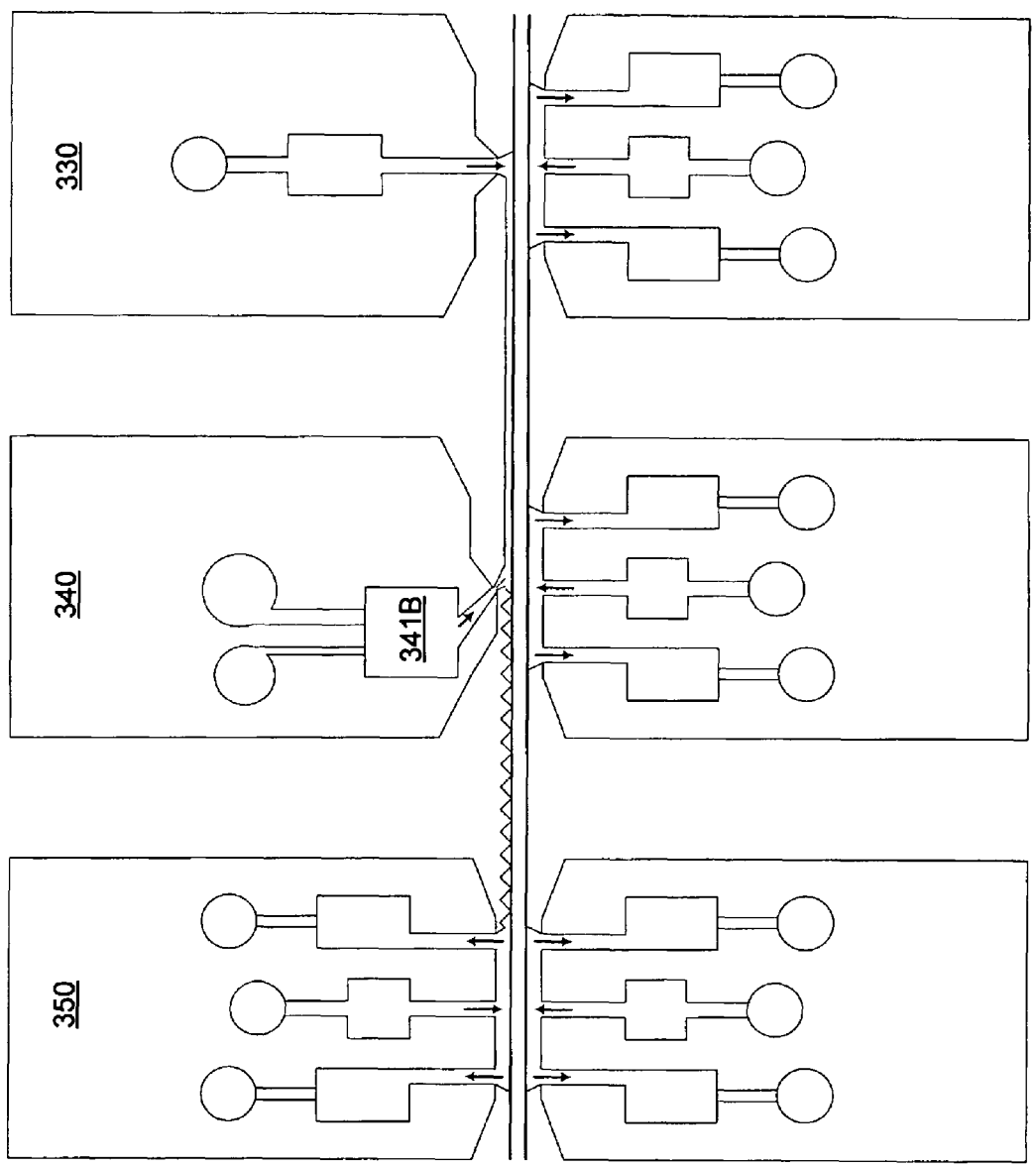
FIG. 10B illustrates a cross-section view of a system for removing particle contaminants from a solid surface, in accordance with an embodiment of the invention.

FIG. 10B illustrates a cross-sectional view of the process arrays 330, 340 and 350, in accordance with an alternative embodiment of the invention similar to that discussed with reference to FIG. 10A. However, the spray jet array 340 as shown includes a linear array of spray jets 341B, which are configured to direct a liquid spray towards the layer of viscoelastic material at an incident angle.

Figure 11A:
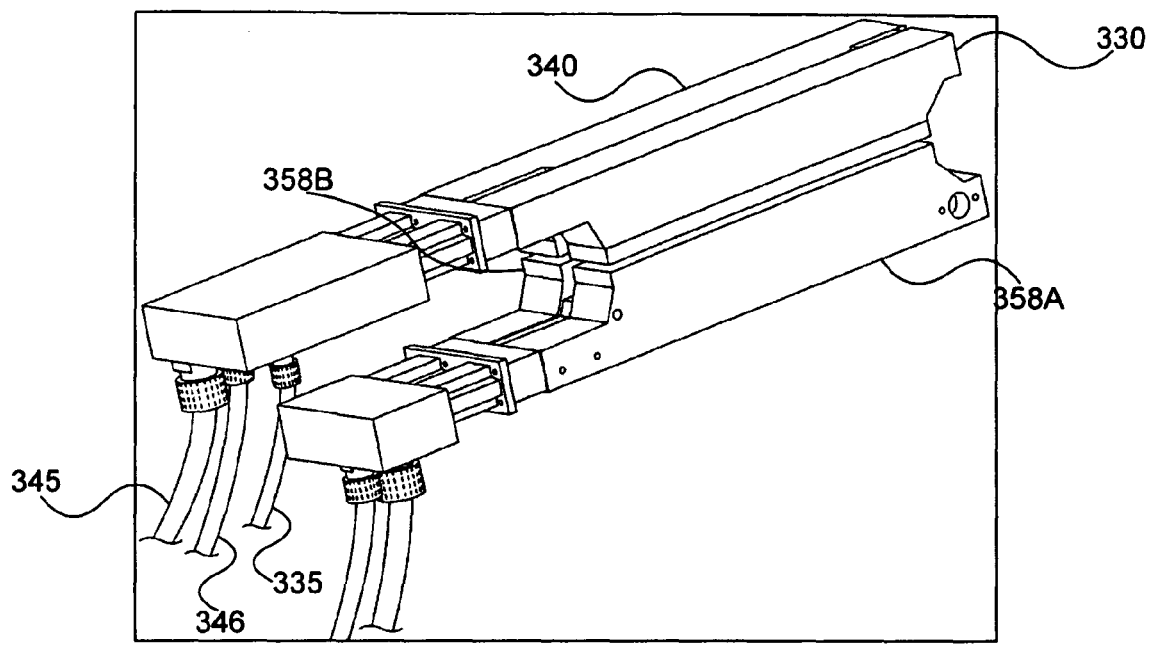
FIGS. 11A and 11B illustrate perspective views of applicator and spray jet arrays, in accordance with an embodiment of the invention.
Figure 11B:
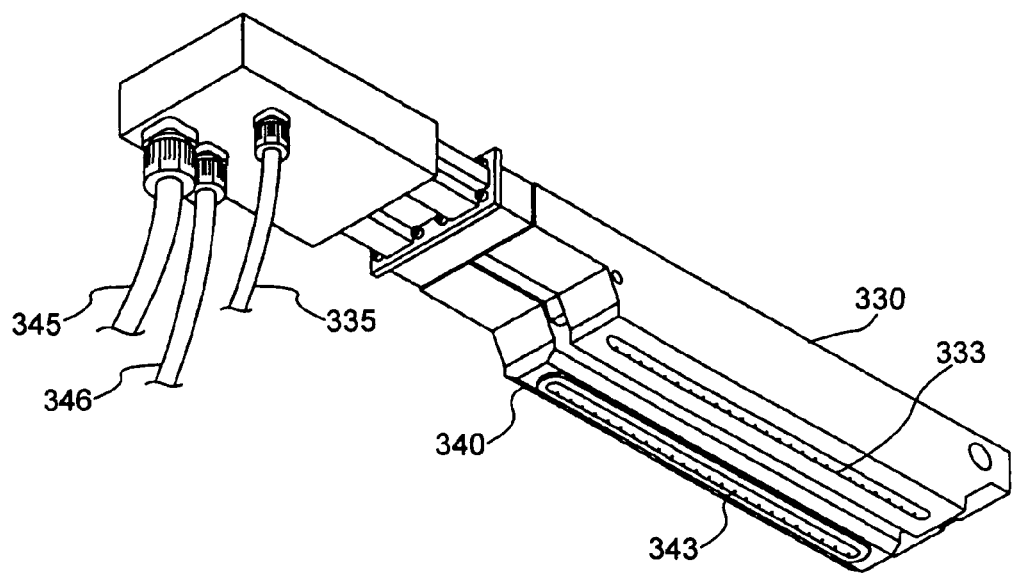

FIGS. 11A and 11B illustrate perspective views of the dispense array 330 and the spray jet array 340, in combination with the opposing arrays 358A and 358B. The dispense array 330 receives the viscoelastic cleaning material via input tube 335, and utilizes an array of dispense heads including dispense head nozzles 333 to apply the viscoelastic material to the surface of a wafer. The spray jet array 340 receives a carrier gas via input tube 345, and receives a liquid via input tube 346. The spray jet array 340 includes a linear array of spray jets which include spray jet nozzles 343. The linear array of spray jets combine the carrier gas and the liquid, and generate a liquid spray that is ejected from the nozzles 343.

Figure 11C:
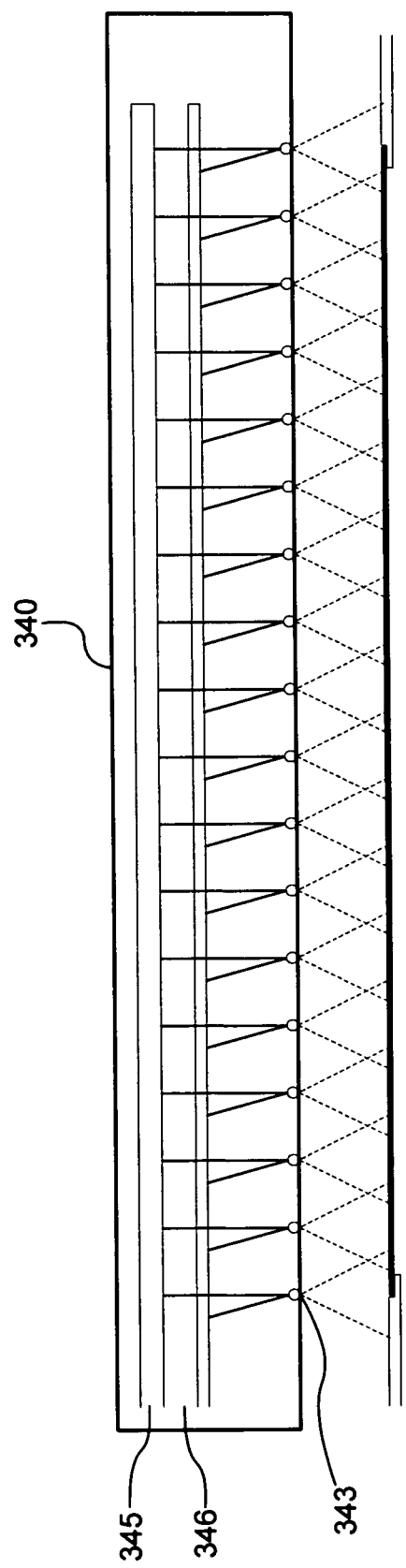
FIG. 11C illustrates a cross-section view of a spray jet array, in accordance with an embodiment of the invention.

FIG. 11C illustrates a front cross-section view of a spray jet array 340, in accordance with an embodiment of the invention. A carrier gas is received via input tube 345, and a liquid is received via input tube 346. The carrier gas is utilized to accelerate the liquid to a high velocity, the resulting liquid spray being ejected from the nozzles 343. Each nozzle provides slight overlapping coverage with an adjacent nozzle, therefore ensuring adequate coverage of the liquid spray.

In an alternative embodiment of the invention, a spray jet (such as spray jet 50 shown at FIG. 2) is utilized to apply a viscoelastic material to the surface of a wafer for cleaning purposes. The use of a spray jet enables acceleration of the viscoelastic material to relatively high velocities, thus providing a source of kinetic energy to the aerosolized viscoelastic material produced by the spray jet. The kinetic energy of the aerosolized viscoelastic material provides a level of cleaning energy which is enhanced by the inherent particle removal efficiency resulting from the chemical structure associated with the viscoelastic material which enables at least partial binding or interaction with surface particles. The kinetic energy carried by the viscoelastic material can also directly provide sufficient energy for the removal of particles by overcoming the adhesion force between the particles and the substrate.

Because the direct application of material at high velocity to a wafer surface may be damaging to certain types of surface structures, it may be desirable to reduce the velocity at which the spray jet propels the viscoelastic material. Therefore, in various embodiments, the velocity of the viscoelastic material is tailored so as to avoid damage to surface structures. In one embodiment, the viscoelastic material is ejected from the spray jet at velocities approximately in the range of 10-50 m/s. In other embodiments, the velocity ranges from approximately 1-200 m/s. Though the velocity may be reduced (for example, as compared to that velocity required to achieve the same particle removal efficiency with DI water alone), the partial binding and/or interaction of the viscoelastic material to surface particles nonetheless improves particle removal efficiency, thus offsetting the reduced kinetic energy imparted to the viscoelastic material.

Additionally, damage to sensitive features can be avoided by controlling the molecular weight distribution of the polymer (viscoelastic material), allowing for more precise control of the energy imparted to the substrate due to the high kinetic energy that the polymer carries. In the operation mode wherein the viscoelastic material directly provides sufficient energy for particle removal, damage can thus be avoided by tightly controlling the molecular weight distribution of the polymer hence avoiding damage caused by the presence of a high energy tail.

Additionally, the solid-like characteristic of the viscoelastic material, which is accessed by virtue of its acceleration to high velocities by the spray jet, may make the viscoelastic material prone to causing damage to surface structures. However, as indicated above, the use of a viscoelastic material enables the velocity to be adjusted as necessary to minimize damage, while still preserving a high degree of cleaning efficiency because of the viscoelastic material's binding and interaction with surface particles.

In order to promote proper formation of aerosolized droplets of the viscoelastic material by the spray jet, the concentration and/or the viscosity of the viscoelastic material may be adjusted. For example, it may generally be necessary to reduce the concentration and viscosity of the viscoelastic material for high velocity application by a spray jet, as compared to that which would be appropriate for application at low speeds.

Because the viscoelastic material is applied at high velocity, subsequent rinse steps require less energy for removal of remaining viscoelastic material and contaminants. For example, when used as part of a spin-bowl system, as illustrated at FIGS. 3A and 3B, application of the viscoelastic material at high velocity by a spray jet promotes removal of surface contaminants on the wafer 130. Accordingly, the wafer 130 may be spun at high rotational speeds, causing the viscoelastic material and contaminants bound therein to be propelled off the wafer 130 by centrifugal force. As the wafer 130 is now fairly clean, additional rinse steps, such as that described above with reference to FIG. 3B, require lower energy—i.e. the spray jet 150 which applies DI water to the surface may be operated at fairly low velocities.

Additionally, the high velocity application of the viscoelastic material by a spray jet may be utilized as part of a linear processing system such as that described above with reference to FIG. 8. In such an embodiments, a linear array of spray jets is utilized to apply to viscoelastic material at high velocity to the surface of a wafer. Subsequent rinse and vacuum processing mechanisms require less energy for removal of the viscoelastic material and bound contaminants because the viscoelastic material has been applied with greater kinetic energy.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A system for removing particle contaminants from the surface of a semiconductor wafer, the system comprising:
   a carrier for holding the semiconductor wafer, the carrier configured to move in a linear fashion;
   a viscoelastic material source;
   an applicator configured to receive the viscoelastic material from the viscoelastic material source, the applicator configured to apply the viscoelastic material to the surface of the semiconductor wafer, the viscoelastic material exhibiting liquid-like behavior and at least partially binding to the particle contaminants when resident on the surface of the semiconductor wafer, the applicator comprising a linear array of applicator nozzles, the linear array of applicator nozzles being configured to simultaneously apply the viscoelastic material across a width equal to or greater than the diameter of the semiconductor wafer;
   a liquid source;
   a carrier gas source;
   a spray jet configured to receive the liquid from the liquid source, the spray jet configured to apply the liquid at high velocity to said applied viscoelastic material, the spray jet receiving the carrier gas from the carrier gas source and utilizing the carrier gas to accelerate the liquid to a high velocity, the volumetric flow rate of the carrier gas being substantially greater than the volumetric flow rate of the liquid, the spray jet comprising a linear array of spray jet nozzles, the linear array of spray jet nozzles being configured to simultaneously apply the liquid across a width equal to or greater than the diameter of the semiconductor wafer;
   wherein the spray jet is positioned adjacent to the applicator such that the linear array of spray jet nozzles is substantially parallel with the linear array of applicator nozzles; and
   wherein the applied viscoelastic material exhibits solid-like behavior under said application of liquid at high velocity, a time duration of a force applied by the high velocity liquid being shorter than an intrinsic characteristic time of relaxation of the viscoelastic material so as to access the solid-like behavior of the viscoelastic material;
   wherein the applied viscoelastic material is dislodged from the surface of the semiconductor wafer under said application of liquid at high velocity.

2. The system of claim 1 wherein the high velocity is approximately in the range of 0.1 to 10 meters per second.

3. The system of claim 1, wherein the viscoelastic material comprises a polymeric compound.

4. The system of claim 3, wherein the carrier gas is nitrogen.

5. The system of claim 4, wherein the liquid is deionized water.

6. The system of claim 1, wherein the linear array of applicator nozzles further comprises a plurality of applicator spray jets,
   each spray jet of the plurality of applicator spray jets for applying the viscoelastic material at high velocity, each spray jet utilizing a carrier gas to accelerate the viscoelastic material to a high velocity, the volumetric flow rate of the carrier gas being substantially greater than the volumetric flow rate of the viscoelastic material.

7. The system of claim 1, further comprising,
   a rinse array positioned opposing the spray jet array, the rinse array configured to rinse an opposite surface of the wafer, the rinse array including a linear array of rinse liquid dispense conduits for dispensing a rinse liquid onto the opposite surface of the wafer, and a linear array of vacuum conduits adjacent to the linear array of rinse liquid dispense conduits, the linear array of vacuum conduits for applying a vacuum force to the opposite surface of the wafer.

8. A system for removing particle contaminants from the surface of a semiconductor wafer, the system comprising:

a bowl having a first annular flange, a second annular flange, and a third annular flange, each of the annular flanges being connected to an interior surface of the bowl;

a rotatable support disposed within the bowl for holding the semiconductor wafer, the rotatable support configured to move vertically between a first process position defined between the first annular flange and the second annular flange, and a second process position defined between the second annular flange and the third annular flange;

a viscoelastic material source;

an applicator configured to receive the viscoelastic material from the viscoelastic material source, the applicator configured to apply the viscoelastic material to the surface of the semiconductor wafer when the rotatable support is positioned at the first process position, the viscoelastic material exhibiting liquid-like behavior and at least partially binding to the particle contaminants when resident on the surface of the semiconductor wafer;

a liquid source;

a carrier gas source;

a spray jet configured to receive the liquid from the liquid source, the spray jet configured to apply the liquid at high velocity to said applied viscoelastic material when the rotatable support is positioned at the second process position, the spray jet receiving the carrier gas from the carrier gas source and utilizing the carrier gas to accelerate the liquid to a high velocity, the volumetric flow rate of the carrier gas being substantially greater than the volumetric flow rate of the liquid, the spray jet having a carrier gas input for receiving the carrier gas and a liquid input for receiving the liquid, the carrier gas input and the liquid input being oriented at an acute angle to each other into the spray jet; and wherein the applied viscoelastic material exhibits solid-like behavior under said application of liquid at high velocity, a time duration of a force applied by the high velocity liquid being shorter than an intrinsic characteristic time of relaxation of the viscoelastic material so as to access the solid-like behavior of the viscoelastic material;

wherein the applied viscoelastic material is dislodged from the surface of the semiconductor wafer under said application of liquid at high velocity.

9. The system of claim 8 wherein the high velocity is approximately in the range of 1 to 1000 meters per second.

10. The system of claim 8, wherein the viscoelastic material comprises a polymeric compound.

11. The system of claim 10, wherein the carrier gas is nitrogen or other inert gas.

12. The system of claim 11, wherein the liquid is deionized water.

13. The system of claim 8, wherein the rotatable support is configured to rotate at a low speed during application of the viscoelastic material and a high speed during application of the liquid at high velocity.

14. The system of claim 13, wherein the low speed is approximately in the range of 1 to 100 revolutions per minute, and the high speed is approximately in the range of 10 to 1000 revolutions per minute.

15. The system of claim 8, wherein the spray jet is configured to move from a position proximate to a center of the semiconductor wafer to a position proximate to an edge of the semiconductor wafer.

16. The system of claim 8, wherein the applicator further comprises,
an applicator spray jet for applying the viscoelastic material at high velocity, the applicator spray jet utilizing a carrier gas to accelerate the viscoelastic material to a high velocity, the volumetric flow rate of the carrier gas being substantially greater than the volumetric flow rate of the viscoelastic material.

17. The system of claim 8, wherein the spray jet is positioned at an angle relative to normal from the surface of the semiconductor wafer.

18. The system of claim 8, wherein the spray jet is configured to move from a position proximate to an edge of the semiconductor wafer to a position proximate to a center of the semiconductor wafer during said application of liquid at high velocity.

* * * * *